(12) United States Patent
Lim et al.

(10) Patent No.: US 11,817,418 B2
(45) Date of Patent: Nov. 14, 2023

(54) SEMICONDUCTOR DEVICE COMPRISING A CAN HOUSING A SEMICONDUCTOR DIE WHICH IS EMBEDDED BY AN ENCAPSULANT

(71) Applicant: Infineon Technologies AG, Neubiberg (DE)

(72) Inventors: Wei Lee Lim, Permatang Pauh (MY); Run Hong Toh, Pulau Pinang (MY); Peng Liang Yeap, Pulau Pinang (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/103,511

(22) Filed: Nov. 24, 2020

(65) Prior Publication Data

US 2021/0159204 A1    May 27, 2021

(30) Foreign Application Priority Data

Nov. 25, 2019    (DE) .......................... 102019131857.2

(51) Int. Cl.
*H01L 23/00*    (2006.01)
*H01L 23/31*    (2006.01)
(Continued)

(52) U.S. Cl.
CPC ............ *H01L 24/73* (2013.01); *H01L 21/563* (2013.01); *H01L 23/295* (2013.01);
(Continued)

(58) Field of Classification Search
CPC . H01L 23/295; H01L 23/321; H01L 23/3121; H01L 23/4922; H01L 23/24;
(Continued)

(56) References Cited

U.S. PATENT DOCUMENTS 5,436,203 A * 7/1995 Lin .................. H01L 23/24
                                                             29/841
5,471,027 A * 11/1995 Call .................. H01L 21/563
                                                             29/841
(Continued)

FOREIGN PATENT DOCUMENTS

DE    10 2015 116 807 A1 * 4/2017 ............ H01L 23/36
JP           2005056873 A     3/2005
(Continued)

*Primary Examiner* — Khiem D Nguyen
(74) *Attorney, Agent, or Firm* — Murphy, Bilak & Homiller, PLLC (57) ABSTRACT

A semiconductor device includes a conductive can include a flat portion and at least one peripheral rim portion extending from an edge of the flat portion, a semiconductor die comprising a first main face and a second main face opposite to the first main face, a first contact pad disposed on the first main face and a second contact pad disposed on the second main face, wherein the first contact pad is electrically connected to the flat portion of the can, an electrical interconnector connected with the second contact pad, and an encapsulant disposed under the semiconductor die so as to surround the electrical interconnector, wherein an external surface of the electrical interconnector is recessed from an external surface of the encapsulant.

16 Claims, 6 Drawing Sheets

(51) Int. Cl.
*H01L 23/29* (2006.01)
*H01L 23/492* (2006.01)
*H01L 21/56* (2006.01)

(52) U.S. Cl.
CPC ...... *H01L 23/3121* (2013.01); *H01L 23/4922* (2013.01); *H01L 24/11* (2013.01); *H01L 24/13* (2013.01); *H01L 24/16* (2013.01); *H01L 24/27* (2013.01); *H01L 24/29* (2013.01); *H01L 24/32* (2013.01); *H01L 24/33* (2013.01); *H01L 24/83* (2013.01); *H01L 2224/1131* (2013.01); *H01L 2224/11462* (2013.01); *H01L 2224/11464* (2013.01); *H01L 2224/13005* (2013.01); *H01L 2224/13111* (2013.01); *H01L 2224/13139* (2013.01); *H01L 2224/13147* (2013.01); *H01L 2224/16227* (2013.01); *H01L 2224/16237* (2013.01); *H01L 2224/2783* (2013.01); *H01L 2224/29005* (2013.01); *H01L 2224/2929* (2013.01); *H01L 2224/29387* (2013.01); *H01L 2224/32225* (2013.01); *H01L 2224/32505* (2013.01); *H01L 2224/33181* (2013.01); *H01L 2224/33505* (2013.01); *H01L 2224/73104* (2013.01); *H01L 2224/73204* (2013.01); *H01L 2224/73253* (2013.01); *H01L 2924/3511* (2013.01); *H01L 2924/35121* (2013.01)

(58) Field of Classification Search
CPC . H01L 23/041; H01L 23/3107; H01L 23/492; H01L 23/49844; H01L 24/13; H01L 24/16; H01L 24/29; H01L 24/32; H01L 24/33; H01L 24/73; H01L 24/83; H01L 21/56; H01L 21/563; H01L 2924/3511; H01L 2924/35121; H01L 24/11; H01L 24/81; H01L 24/92; H01L 24/05; H01L 24/10

USPC .......................................... 257/687
See application file for complete search history.

(56) References Cited

U.S. PATENT DOCUMENTS

| | | | | |
|---|---|---|---|---|
| 6,092,281 | A * | 7/2000 | Glenn | H01L 23/552 438/218 |
| 7,786,591 | B2 * | 8/2010 | Khan | H01L 23/13 257/E23.079 |
| 8,466,546 | B2 * | 6/2013 | Farlow | H01L 24/29 257/E23.005 |
| 10,134,687 | B1 | 11/2018 | Kim et al. | |
| 10,410,999 | B2 * | 9/2019 | Baloglu | H01L 23/552 |
| 11,302,610 | B2 * | 4/2022 | Dinkel | H01L 24/40 |
| 2006/0237840 | A1 * | 10/2006 | Standing | H01L 24/83 257/723 |
| 2007/0090523 | A1 * | 4/2007 | Otremba | H01L 24/40 257/E23.125 |
| 2007/0259514 | A1 * | 11/2007 | Otremba | H01L 24/10 257/E23.044 |
| 2008/0246127 | A1 * | 10/2008 | Larking | H01L 24/37 257/664 |
| 2009/0146269 | A1 | 6/2009 | Chow et al. | |
| 2011/0292621 | A1 * | 12/2011 | Beaumier | H01L 23/10 361/748 |
| 2014/0306327 | A1 * | 10/2014 | Schulze | H01L 24/11 438/106 |
| 2016/0293524 | A1 * | 10/2016 | Grassmann | H01L 23/3114 |
| 2019/0189566 | A1 * | 6/2019 | Kim | H01L 24/94 |
| 2019/0259688 | A1 * | 8/2019 | Scharf | H01L 23/3135 |
| 2021/0159204 | A1 * | 5/2021 | Lim | H01L 24/83 |

FOREIGN PATENT DOCUMENTS

| | | |
|---|---|---|
| JP | 2005203525 A | 7/2005 |
| KR | 20000041033 A | 7/2000 |
| KR | 20040060535 A | 7/2004 |
| KR | 20160009914 A | 1/2016 |

* cited by examiner

SEMICONDUCTOR DEVICE COMPRISING A CAN HOUSING A SEMICONDUCTOR DIE WHICH IS EMBEDDED BY AN ENCAPSULANT

TECHNICAL FIELD

The present disclosure is related to a semiconductor device and to a method for fabricating a semiconductor device. The present disclosure is in particular related to a semiconductor device which comprises a semiconductor die which is embedded by an encapsulant.

BACKGROUND

In the field of semiconductor device fabrication, in particular the fabrication of semiconductor MOSFET OR IGBT devices, a lot of different package types have been developed and investigated in the past years. One package type, which is also known as DirectFet, comprises a conductive can (or clip) comprising a flat portion and at least one peripheral rim portion extending from an edge of the flat portion, and a semiconductor die mounted within an interior volume of the can. The can is connected with an upper one of the electrical contact pads of the semiconductor die. The lower contact pads of the semiconductor die are connected with electrical interconnectors the lower surfaces of which are essentially coplanar with the lower surface of the rim. The so constructed device can be mounted onto a PCB by connecting the lower ends of the rim and the electrical interconnectors with contact pads of the PCB.

SUMMARY

Recent investigations have shown that problems may arise from thermal mechanical stress within the device. After conducting temperature cycle tests there were detected cracks and voids within the solder bumps which were used as the electrical interconnectors. Those cracks and voids can lead to delamination and ultimately to complete failure of the electrical device. The cracks and voids were found to be mainly induced by thermal mechanical stress due to a mismatch of the coefficients of thermal expansion (CTE) between the different components used in the device.

A first aspect of the present disclosure is related to a semiconductor device, comprising a conductive can comprising a flat portion and at least one peripheral rim portion extending from an edge of the flat portion, a semiconductor die comprising a first main face and a second main face opposite to the first main face, a first contact pad disposed on the first main face and a second contact pad disposed on the second main face, wherein the first contact pad is electrically connected to the flat portion of the can, an electrical interconnector connected with the second contact pad, and an encapsulant disposed under the semiconductor die so as to surround the electrical interconnector, wherein an external surface of the electrical interconnector is recessed from an external surface of the encapsulant.

A second aspect of the present disclosure is related to a semiconductor device, comprising a conductive can comprising a flat portion and at least one peripheral rim portion extending from an edge of the flat portion, a semiconductor die comprising a first main face and a second main face opposite to the first main face, a first contact pad disposed on the first main face and a second contact pad disposed on the second main face, wherein the first contact pad is electrically connected to the flat portion of the can, an electrical interconnector connected with the second contact pad, and an encapsulant disposed under the semiconductor die so as to surround the electrical interconnector, wherein an external surface of the electrical interconnector is protruded from an external surface of the encapsulant, wherein the encapsulant is configured to surround at least 40% of the height of the electrical interconnector.

A third aspect of the present disclosure is related to a method for fabricating a semiconductor device, the method comprising providing a conductive can comprising a flat portion and at least one peripheral rim portion extending from an edge of the flat portion, providing a semiconductor die comprising a first main face and a second main face opposite to the first main face, a first contact pad disposed on the first main face and a second contact pad disposed on the second main face, connecting the first contact pad electrically to the flat portion of the rim, disposing an encapsulant under the semiconductor die, the encapsulant covering the second contact pad, forming a through-hole into the encapsulant, the through-hole reaching from a surface of the encapsulant to the second contact pad, and fabricating an electrical interconnector by filling an electrical interconnector material into the through-hole.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

FIG. 1 comprises FIGS. 1A and 1B and shows a schematic cross-sectional representation of a semiconductor device according to the first aspect, in which device external surfaces of the electrical interconnectors are recessed from an external surface of the encapsulant and in which the encapsulant is only disposed on the semiconductor die and the electrical interconnectors (FIG. 1A), and the semiconductor device mounted on a PCB (FIG. 1B).

FIG. 2 comprises FIGS. 2A and 2B and shows a schematic cross-sectional representation of a semiconductor device according to the first aspect, in which device external surfaces of the electrical interconnectors are recessed from an external surface of the encapsulant and in which the encapsulant is disposed on the semiconductor die and the electrical interconnectors and also on the other portions of the interior volume of the can (FIG. 2A), and the semiconductor device mounted on a PCB (FIG. 2B).

FIG. 3 comprises FIGS. 3A and 3B and shows a schematic cross-sectional representation of a semiconductor device according to the second aspect, in which device external surfaces of the electrical interconnectors are protruded from an external surface of the encapsulant (FIG. 3A), and the semiconductor device mounted on a PCB (FIG. 3B), the enlarged insert showing in detail the connection between the electrical interconnector and the PCB solder layer.

DETAILED DESCRIPTION

The application of the encapsulant has mainly the following advantages. Firstly, the encapsulant helps to reduce the thermal mechanical stress at the area of the electrical interconnectors. The encapsulant can in particular help to prevent fatigue crack of the electrical interconnector as such fatigue crack can be absorbed by the encapsulant material due to the ductile behavior of the encapsulant material. In such a way the life span of the electrical interconnectors can be prolonged by a factor of 3 which has been found out by temperature cycle stress experiments (thermal cycle range from −40° C. to +125° C.). Secondly, the encapsulant can help to prevent warpage of the package. Such warpage mainly occurs due to different CTE values between the different components, in particular between the electrical interconnector, e.g. solder bumps, and the PCB. The encapsulant can reduce the mismatch between the electrical interconnector, e.g. the solder bump, and the PCB and can also give the package more cohesiveness and stability so that warpage can be prevented.

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

Figure 1A:
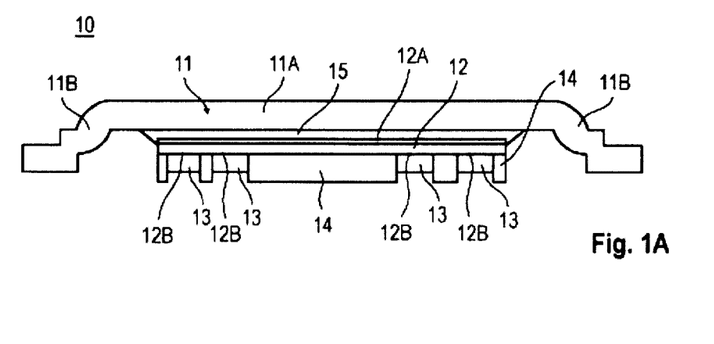
Figure 1B:
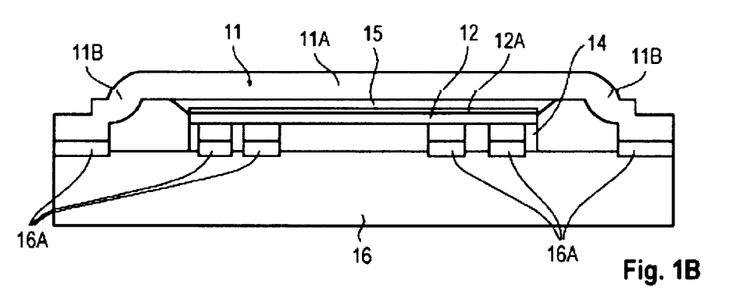

FIG. 1 comprises FIGS. 1A and 1B and shows a schematic cross-sectional representation of a semiconductor device according to the first aspect (A), and the semiconductor device mounted on a PCB (B).

FIG. 1A shows the semiconductor device 10 which comprises a conductive can 11 comprising a flat portion 11A and two peripheral opposing rim portions 11B extending from opposing edge portions of the flat portion 11A. The semiconductor device 10 further comprises a semiconductor die 12 comprising a first main face and a second main face opposite to the first main face, a first contact pad 12A disposed on the first main face and second contact pads 12B disposed on the second main face, wherein the first contact pad 12A is electrically connected to the flat portion 11A of the can 11. The semiconductor device 10 further comprises electrical interconnectors 13 each one of which being connected with one of the second contact pads 12B. The semiconductor device 10 further comprises an encapsulant 14 disposed under the semiconductor die 12 so as to surround the electrical interconnectors 13, wherein external surfaces of the electrical interconnectors 13 are recessed from an external surface of the encapsulant 14.

"Can" is the usual term of a conductive clip or cup which usually has the structure of a flat portion to the interior surface of which the semiconductor is connected, and a rim portion which is connected to an edge of the flat portion. In the present embodiment as shown in FIG. 1, the can 11 comprises two opposite rim portions 11B both being connected to left and right edges of the flat portion 11A. Hence this embodiment of a semiconductor package comprises two opposite separate rim portions 11B. However, the rim can also be formed of one part having a contiguous annular shape.

The embodiment of a semiconductor device 10 as shown in FIG. 1 is such that the encapsulant 14 is only disposed on the semiconductor die 12, thereby surrounding the electrical interconnectors 13. It is not disposed on the rim 11 or other components in the inner volume of the can 11 such as the adhesive layer 15 with which the first contact pad 12A can be connected to the flat portion 11A of the can 11.

FIG. 1B shows the semiconductor device 10 mounted on a PCB 15. The PCB 16 comprises solder layers pads 16A at an upper surface thereof. The two rim portions 11B and the electrical interconnectors 13 are connected with the solder layers 16A.

According to an embodiment of the semiconductor device of FIG. 1, the encapsulant 14 comprises one or more of an organic epoxy compound, an epoxy resin, and a biphenyl epoxy resin. According to a further embodiment thereof the encapsulant 14 comprises a filler material, in particular particles of SiO (silica).

According to an embodiment of the semiconductor device 10 of FIG. 1, the encapsulant 14 is an organic epoxy compound filled with silica particles. In such a case the CTE can be brought down into the teens (10 to $20 \times 10^{-6}/°$ C.). Using biphenyl or similar epoxy types allows more filler to be added and brings the CTE down to the high single digits but still not as the CTE of silicon, which is about $3 \times 10^{-6}/°$ C.

The encapsulant 14 can be filled in liquid form into the interior volume of the can 11 after the semiconductor die 12 has been connected to the bottom of the can 11. Upon curing, the hardened encapsulant 14 exhibits high modulus, low CTE matching that of the solder joint as an example of the electrical interconnector, low moisture absorption, and good adhesion towards the semiconductor die 12 and the can 11. Thermal stresses on the solder joints are redistributed among the die, the encapsulant 14, the can 11, and all the solder joints, instead of concentrating on the peripheral joints. It has been shown that the application of the encapsulant 14 can reduce the all-important strain level to 0.10-0.25 of the strain in the interconnectors, which are not encapsulated. Therefore, the encapsulant 14 can increase the fatigue life of a solder joint as electrical interconnector by a factor of 3.

According to an embodiment of the semiconductor device 10 of FIG. 1, a top surface of the can 11 is exposed or not covered by the encapsulant 14. This would allow for an improved heat dissipation by, for example, mounting a heat sink onto the exposed top surface of the can 11.

According to an embodiment of the semiconductor device 10 of FIG. 1, a height of the electrical interconnectors 13 is in a range of 40% to 80%, of a height of the encapsulant 14, wherein the height is measured from the second main face of the semiconductor die 12, wherein the lower bound of the range can also be at 45%, 50%, 55%, 60%, 65%, or 70%, and likewise the upper bound of the range can also be at 75%, 70%, 65%, 60%, 55%, or 50%. In other words, a thickness of the electrical interconnectors 13 is in the above-mentioned range of a thickness of the encapsulant 14 over the second main face of the semiconductor die 12.

According to an embodiment of the semiconductor device 10 of FIG. 1, the electrical interconnectors 13 each comprise one or more of a solder-based alloy, an alloy of Sn/Ag/Cu, and a copper pillar.

According to an embodiment of the semiconductor device 10 of FIG. 1, no solder is provided on the external surface of the electrical interconnectors 13 as there can be solder layers 16A on the PCB 16 as shown in FIG. 1B. The solder layers 15A are protruding from an upper surface of the PCB 15 and they engage into the lower empty portions of the through-holes and make contact with the electrical interconnectors 13.

According to an embodiment of the semiconductor device 10 of FIG. 1, the first contact pad 12A is connected by an adhesive layer 15 to the flat portion 11A of the can 11, wherein the encapsulant is also attached to the adhesive layer 15. According to a further example thereof the adhesive layer 15 comprises one or more of low-molecular-weight carbohydrates and dextrin.

According to an embodiment of the semiconductor device 10 of FIG. 1, the semiconductor die 12 comprises a power semiconductor die comprising terminals, wherein the flat portion 11A of the can 11 is connected with one terminal, and the one or more electrical interconnectors 13 are connected with the other terminals. The lower ends of the two rim portions 11B are connected each with a contact pad 16A of the PCB 16.

Figure 2A:
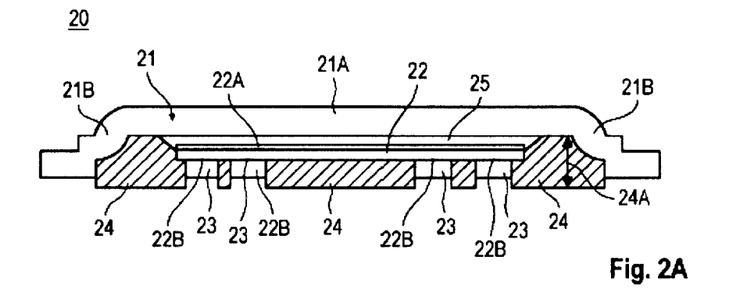
Figure 2B:
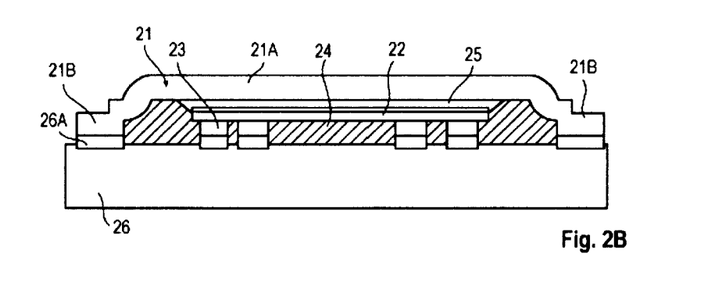

FIG. 2 comprises FIGS. 2A and 2B and shows a schematic cross-sectional representation of a semiconductor device according to the first aspect (A), and the semiconductor device mounted on a PCB (B).

FIG. 2A shows the semiconductor device 20 which comprises a conductive can 21 comprising a flat portion 21A and two peripheral opposing rim portions 21B extending from opposing edge portions of the flat portion 21A. The semiconductor device 20 further comprises a semiconductor die 22 comprising a first main face and a second main face opposite to the first main face, a first contact pad 22A disposed on the first main face and second contact pads 22B disposed on the second main face, wherein the first contact pad 22A is electrically connected to the flat portion 21A of the can 21. The semiconductor device 20 further comprises electrical interconnectors 23 each one of which being connected with one of the second contact pads 22B. The semiconductor device 20 further comprises an encapsulant 24 disposed under the semiconductor die 22 so as to surround the electrical interconnectors 23, wherein external surfaces of the electrical interconnectors 23 are recessed from an external surface of the encapsulant 24.

The only difference to the embodiment of FIG. 1 is that the encapsulant 24 is disposed so as to fill a space between the semiconductor die 22 and the flat portion 21A and the rim portions 21B of the can 21, wherein the gap from the interconnectors 23 to the rim portions 21B also can be filled by the encapsulant. Hence the encapsulant 24 is not only disposed on the semiconductor die 22 surrounding the electrical interconnectors 23, but is also disposed on the rim 21 and the side faces of the semiconductor die 22 and the adhesive layer 25. FIG. 2B shows the semiconductor device 20 mounted on a PCB 26. The PCB 26 comprises contact pads 26A and the electrical interconnectors 23 are connected to the contact pads 26A in the same way as was explained in connection with FIG. 1.

The arrow 24A in FIG. 2A indicates an entire height of the encapsulant 24 which is defined by a distance from a lower main face of the encapsulant 24 and a lower main face of the flat portion 21A of can 21. A height of the cavity is defined by a distance between the lower main face of the flat portion 21A and a lower main face of the rim portions 21B. In general the entire height 24A of the encapsulant 24 is in a range from 80% to 120% of the cavity height. In the embodiment of FIG. 2A the entire height 24A of the encapsulant 24 is greater than the cavity height.

In the embodiment of a semiconductor device 20 as shown in FIG. 2, the entire height of the encapsulant 24 is dimensioned so that a lower surface of the encapsulant 24 is in contact with an upper surface of the PCB 26. This configuration would be optimal for thermal dissipation, but is not absolutely necessary. It is also possible that the entire height of the encapsulant 24 is less than that so that the lower surface of the encapsulant 24 is not in contact with the upper surface of the PCB 26. This can be made dependent on the manufacturing capabilities although in such a case the problems of CTE mismatch and thermal dissipation are then not optimally solved. Furthermore, FIG. 2A shows that the encapsulant 24A has a spatially constant entire height. However, it is also possible that the entire height varies spatially.

Figure 3A:
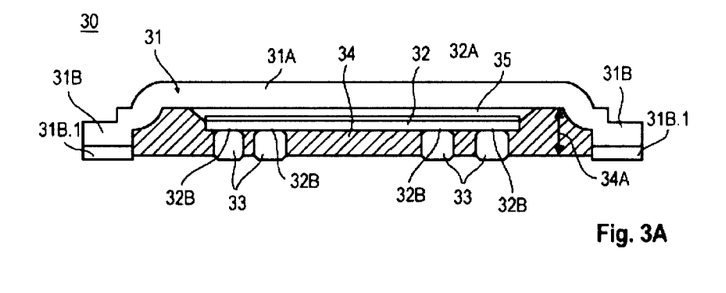
Figure 3B:
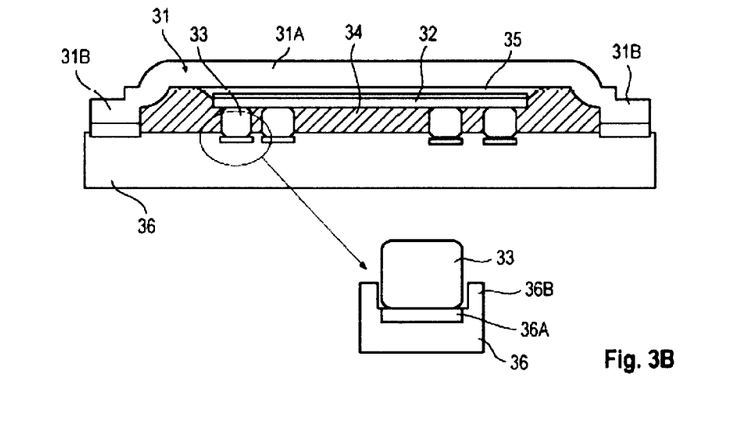

FIG. 3 comprises FIGS. 3A and 3B and shows a schematic cross-sectional representation of a semiconductor device according to the first aspect (A), and the semiconductor device mounted on a PCB (B).

FIG. 3A shows the semiconductor device 30 which comprises a conductive can 31 comprising a flat portion 31A and two peripheral opposing rim portions 31B extending from opposing edge portions of the flat portion 31A. The semiconductor device 30 further comprises a semiconductor die 32 comprising a first main face and a second main face opposite to the first main face, a first contact pad 32A disposed on the first main face and second contact pads 32B disposed on the second main face, wherein the first contact pad 32A is electrically connected to the flat portion 31A of the can 31. The semiconductor device 30 further comprises electrical interconnectors 33 each one of which being connected with one of the second contact pads 32B. The semiconductor device 30 further comprises an encapsulant 34 disposed under the semiconductor die 32 so as to surround the electrical interconnectors 33, wherein external surfaces of the electrical interconnectors 33 are protruded from an external surface of the encapsulant 34. In one embodiment of FIG. 3, major part of the interconnector 23, e.g. more than 40% or 50% of the height of the interconnector, is surrounded by the encapsulant. This is beneficial for mitigating the mismatch of CTE values of the interconnector 23 and the PCB 36.

The rim portions 31B may comprise conductive layers 31B.1 at the lower ends to make contact with respective conductive pads on the PCB 36. The conductive layers 31B.1 can, for example, be solder layers.

FIG. 3B shows the semiconductor device 30 mounted on a PCB 36. The PCB 36 comprises solder layers 36A at an upper surface thereof. The two opposite rim portions 31B and the electrical interconnectors 33 are connected with the contact pads 36A. In one embodiment of FIG. 3, the solder layers 36A are recessed from an upper surface of the PCB 36 and the protruding portions of the electrical interconnectors 33 reach into the empty portions of the PCB 36 and make contact with the solder layers 36A. In another embodiment, the solder layers 26A do not need to be recessed from the upper surface of the PCB 26.

According to an embodiment such as shown in FIG. 3, the encapsulant 34 is disposed so as to fill a space between the semiconductor die 32 and the flat portion 31A and the rim portions 31B of the can 31.

According to an embodiment of the semiconductor device of FIG. 3, the encapsulant 34 comprises one or more of an organic epoxy compound, an epoxy resin, and a biphenyl epoxy resin. According to a further embodiment thereof the encapsulant 34 comprises a filler material, in particular particles of SiO (silica).

According to an embodiment of the semiconductor device 30 of FIG. 3, the encapsulant 34 is an organic epoxy compound filled with silica particles. In such a case the CTE can be brought down into the teens (10 to $20 \times 10^{-6}/°$ C.). Using biphenyl or similar epoxy types allows more filler to be added and brings the CTE down to the high single digits but still not as the CTE of silicon, which is about $3 \times 10^{-6}/°$ C.

The encapsulant 34 can be filled in liquid form into the interior volume of the can 31 after the semiconductor die 32 has been connected to the bottom of the can 31. Upon curing, the hardened encapsulant 34 exhibits high modulus, low CTE matching that of the electrical interconnector, e.g. a solder joint, low moisture absorption, and good adhesion towards the semiconductor die 32 and the can 31. Thermal stresses on the electrical interconnectors are redistributed among the semiconductor die 32, the encapsulant 34, the can 31, and all the solder joints, instead of concentrating on the peripheral joints. It has been shown that the application of the encapsulant 34 can reduce the all-important strain level to 0.10-0.25 of the strain in the interconnectors, which are not encapsulated. Therefore the encapsulant 34 can increase the fatigue life of an electrical interconnector, e.g. solder bump, by a factor of 3.

According to an embodiment of the semiconductor device 30 of FIG. 3, a top surface of the can 31 is exposed or not covered by the encapsulant 34. This would allow for an improved heat dissipation by, for example, mounting a heat sink onto the exposed top surface of the can 31.

According to an embodiment of the semiconductor device 30 of FIG. 3, a protruding portion of the electrical interconnector is in a range of 20% to 40% of the overall height of the electrical interconnector, wherein the lower bound of the range can also be at 25%, 30%, or 35%, and likewise the upper bound of the range can also be at 35%, 30%, or 25%. The arrow 26B in the insert indicates the 20% to 40% of the overall height of the electrical interconnector 23.

The arrow 34A in FIG. 3A again indicates an entire height of the encapsulant 34 which is defined in the same way as the entire height 24A in FIG. 2A. In general the entire height 24A or 34A of the encapsulant 24 or 34 is in a range from 80% to 120% of the cavity height. In the embodiment of FIG. 3A the entire height 34A of the encapsulant 34 is smaller than the cavity height.

According to an embodiment of the semiconductor device 30 of FIG. 3, the electrical interconnectors 33 each comprise one or more of a solder-based alloy, an alloy of Sn/Ag/Cu, and a copper pillar.

According to an embodiment of the semiconductor device 30 of FIG. 3, no solder is provided on the external surface of the electrical interconnectors 33 as there can be solder layers 36A on the PCB 36 as shown in FIG. 3B.

According to an embodiment of the semiconductor device 30 of FIG. 3, the semiconductor die 32 comprises a power semiconductor die comprising terminals, wherein the rim 31 is connected with one terminal, and the one or more electrical interconnectors 33 are connected with the other terminals.

According to an embodiment of the semiconductor device 30 of FIG. 3, the first contact pad 32A is connected by an adhesive layer 35 to the flat portion 31A of the can 31, wherein the encapsulant is also attached to the adhesive layer 35. According to a further example thereof the adhesive layer 35 comprises one or more of low-molecular-weight carbohydrates and dextrin.

Figure 4:
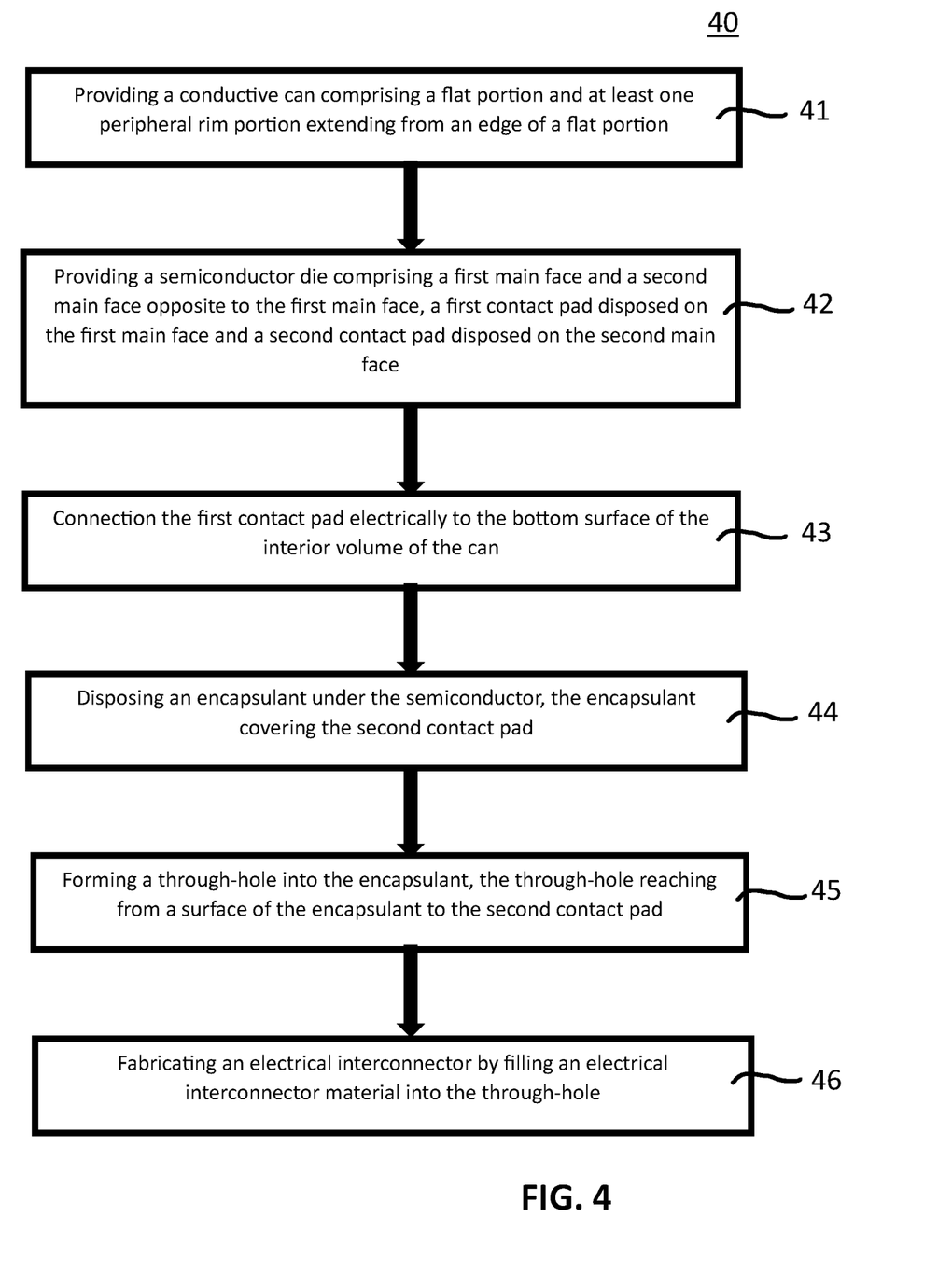
FIG. 4 shows a flow diagram for illustrating a method for fabricating a semiconductor device according to the third aspect, wherein the method is adapted to fabricate semiconductor devices of both the first and second aspects FIG. 5 comprises FIGS. 5A to 5E and illustrates a method for fabricating a semiconductor device according to the third aspect by showing schematic cross-sectional representations of a beginning form of the semiconductor device (FIG. 5A), an intermediate product obtained after applying the encapsulant to the beginning form (FIG. 5B), an intermediate product obtained after drilling through-holes into the encapsulant (FIG. 5C), the semiconductor device obtained after filling an electrical interconnector material into the through-holes of the intermediate product (FIG. 5D), and the semiconductor device after mounting on a PCB (FIG. 5E).

FIG. 4 shows a flow diagram for illustrating a method for fabricating a semiconductor device according to the third aspect.

According to FIG. 4 the method 40 comprises providing a conductive can comprising a flat portion and at least one peripheral rim portion extending from an edge of the flat portion (41), providing a semiconductor die comprising a first main face and a second main face opposite to the first main face, a first contact pad disposed on the first main face and a second contact pad disposed on the second main face (42), connecting the first contact pad electrically to the bottom surface of the interior volume of the can (43), disposing an encapsulant under the semiconductor, the encapsulant covering the second contact pad (44), forming a through-hole into the encapsulant, the through-hole reaching from a surface of the encapsulant to the second contact pad (45), and fabricating an electrical interconnector by filling an electrical interconnector material into the through-hole (46).

According to an embodiment of the method of FIG. 4, filling an electrical interconnector material into the through-hole is performed such that an external surface of the fabricated electrical interconnector is recessed from an external surface of the encapsulant. Such an embodiment is thus configured to fabricate a semiconductor device according to the first aspect.

According to an embodiment of the method of FIG. 4, filling an electrical interconnector material into the through-hole is performed such that an external surface of the fabricated electrical interconnector is protruded from an external surface of the encapsulant. Such an embodiment is thus configured to fabricate a semiconductor device according to the second aspect.

According to an embodiment of the method of FIG. 4, forming a through-hole into the encapsulant is performed by laser ablation. The through-hole can also be formed by lithography patterning.

According to an embodiment of the method of FIG. 4, filling an electrical interconnector material into the through-hole is performed by one of dispensing, printing, galvanic plating, and electroless plating.

Further embodiments of the method of FIG. 4 can be formed by combining it with any one of the embodiments or features as were mentioned above in connection with the semiconductor devices of the first and second aspects.

FIG. 5 comprises FIGS. 5A to 5E and illustrates a method for fabricating a semiconductor device according to the third aspect by showing schematic cross-sectional representations of intermediate products (A-C), a fabricated semiconductor device (D), and the semiconductor device mounted on a PCB (E).

Figure 5A:
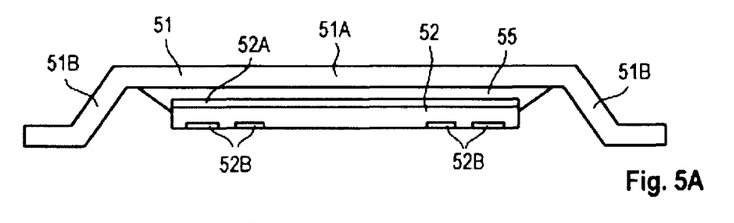

FIG. 5A shows a beginning form of a semiconductor device which comprises a conductive can 51 comprising a flat portion 51A and two peripheral rim portions 51B disposed in an opposed relationship and extending from opposing edges of the flat portion 51, and a semiconductor die 52 comprising a first main face and a second main face opposite to the first main face, a first contact pad 52A disposed on the first main face and a plurality of second contact pads 52B disposed on the second main face, wherein the first contact pad 52A is electrically connected to the flat portion 51A of the can 51.

Figure 5B:
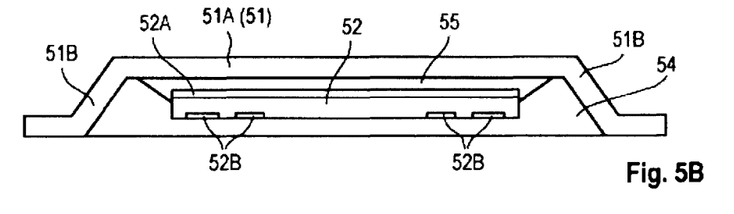

FIG. 5B shows an intermediate product after applying an encapsulant 54 wherein it is necessary that the encapsulant 54 covers the second main face of the semiconductor die 52 and the second contact pads 52B. As shown in the embodiment of FIG. 5B, the encapsulant 54 is applied so that it completely fills the interior volume of the can 51, or in other words so that it completely fills a space between the semiconductor die 52 and the flat portion 51A and the rims 51B of the can 51. The encapsulant 54 can be applied by molding, in particular by either one of transfer molding or compression molding.

Figure 5C:
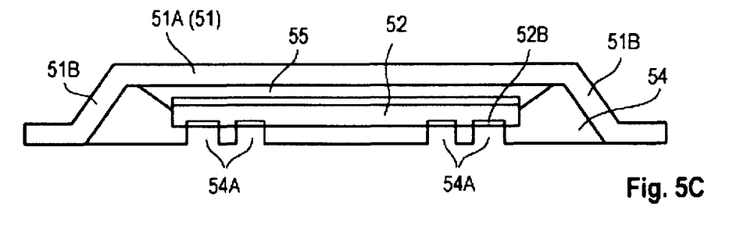

FIG. 5C shows an intermediate product after drilling through-holes into the encapsulant 54 wherein the through-holes are arranged so that they reach from a lower surface of the encapsulant 54 up to the lower surfaces of the second contact pads 52B of the semiconductor die 52. The drilling can be performed by laser drilling.

Figure 5D:
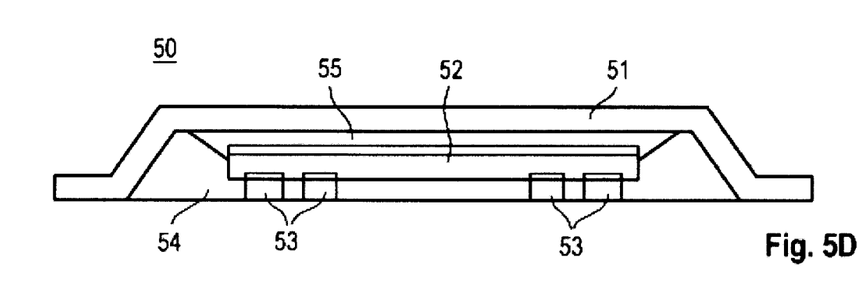

FIG. 5D shows the semiconductor device 50 obtained after filling an electrical interconnector material into the through-holes 54A of the encapsulant 54, thereby fabricating electrical interconnectors 53.

Figure 5E:
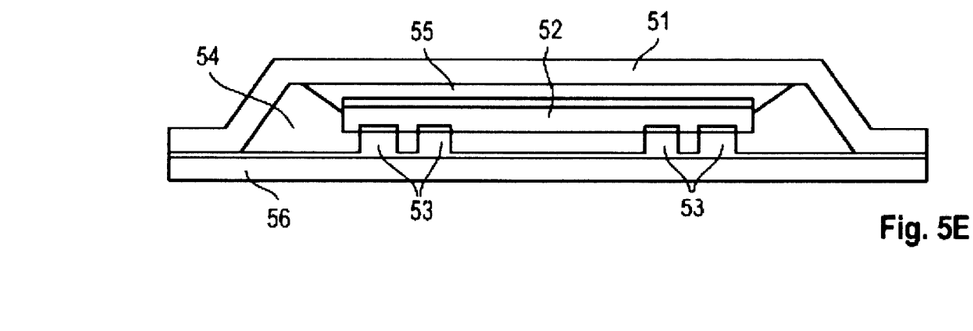

FIG. 5E shows the semiconductor device 50 after mounting on a PCB 56.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor device, comprising
a conductive can comprising a flat portion and at least one peripheral rim portion extending from an edge of the flat portion;
a semiconductor die comprising a first main face and a second main face opposite to the first main face, a first contact pad disposed on the first main face and a second contact pad disposed on the second main face, wherein the first contact pad is electrically connected to the flat portion of the conductive can;
an electrical interconnector connected with the second contact pad; and
an encapsulant disposed under the semiconductor die so as to surround the electrical interconnector, the encapsulant also filling a space between the conductive can and the side faces of the semiconductor die,
wherein an external surface of the electrical interconnector is recessed from an external surface of the encapsulant,
wherein the electrical interconnector comprises a region of solder material that is directly in contact with the second contact pad,
wherein the encapsulant is disposed exclusively on a same side of the conductive can as the semiconductor die.

2. The semiconductor device according to claim 1, wherein
a top surface of the can is exposed by or not covered by the encapsulant.

3. The semiconductor device according to claim 1, wherein
a height of the electrical interconnector is in a range of 40% to 80% of a height of the encapsulant, wherein the height is measured from the second main face of the semiconductor die.

4. The semiconductor device according to claim 1, wherein
the encapsulant comprises one or more of an organic epoxy compound, an epoxy resin, and a biphenyl epoxy resin.

5. The semiconductor device according to claim 1, wherein the encapsulant comprises a filler material, wherein the filler material comprises particles of silica.

6. The semiconductor device according to claim 1, wherein no solder is provided on the external surface of the electrical interconnector.

7. The semiconductor device according to claim 1, wherein the semiconductor die comprises a power semiconductor die comprising terminals, wherein the rim portion is connected with one terminal, and the one or more electrical interconnectors are connected with the other terminals.

8. The semiconductor device according to claim 1, wherein an entire height of the encapsulant is greater than a height of the cavity.

9. A semiconductor device, comprising
a conductive can comprising a flat portion and at least one peripheral rim portion extending from an edge of the flat portion;
a semiconductor die comprising a first main face and a second main face opposite to the first main face, a first contact pad disposed on the first main face and a second contact pad disposed on the second main face, wherein the first contact pad is electrically connected to the flat portion of the conductive can;
an electrical interconnector connected with the second contact pad;
an encapsulant disposed only under the semiconductor die so as to surround the electrical interconnector;
an external surface of the electrical interconnector is recessed from an external surface of the encapsulant; and
a PCB having solder pads at an upper surface thereof, the solder pads in contact with the at least one peripheral rim portion and the electrical interconnector,
wherein the encapsulant does not fill a space between the conductive can and the side faces of the semiconductor die,
wherein the encapsulant is in contact with an upper surface of the PCB.

10. The semiconductor device according to claim 9, wherein
a top surface of the can is exposed by or not covered by the encapsulant.

11. The semiconductor device according to claim 9, wherein
a height of the electrical interconnector is in a range of 40% to 80% of a height of the encapsulant, wherein the height is measured from the second main face of the semiconductor die.

12. The semiconductor device according to claim 9, wherein
the encapsulant comprises one or more of an organic epoxy compound, an epoxy resin, and a biphenyl epoxy resin.

13. The semiconductor device according to claim 9, wherein the encapsulant comprises a filler material, wherein the filler material comprises particles of silica.

14. The semiconductor device according to claim 9, wherein the electrical interconnector comprises one or more of a solder based alloy, an alloy of Sn/Ag/Cu, and a copper pillar.

15. The semiconductor device according to claim 9, wherein no solder is provided on the external surface of the electrical interconnector.

16. The semiconductor device according to claim 9, wherein the semiconductor die comprises a power semiconductor die comprising terminals, wherein the rim portion is connected with one terminal, and the one or more electrical interconnectors are connected with the other terminals.

* * * * *

UNITED STATES PATENT AND TRADEMARK OFFICE
CERTIFICATE OF CORRECTION

PATENT NO. : 11,817,418 B2
APPLICATION NO. : 17/103511
DATED : November 14, 2023
INVENTOR(S) : W. Lim et al.

It is certified that error appears in the above-identified patent and that said Letters Patent is hereby corrected as shown below:

On the Title Page (57) Abstract, Line 1, please change "include a" to -- comprising a --

Signed and Sealed this
Twentieth Day of February, 2024

*Katherine Kelly Vidal*

Katherine Kelly Vidal
*Director of the United States Patent and Trademark Office*